(12) United States Patent
Tateishi et al.

(10) Patent No.: US 11,996,350 B2
(45) Date of Patent: May 28, 2024

(54) COOLER AND SEMICONDUCTOR APPARATUS

(71) Applicant: FUJI ELECTRIC CO., LTD., Kawasaki (JP)

(72) Inventors: Yoshihiro Tateishi, Kawasaki (JP); Takahiro Koyama, Kawasaki (JP); Hiromichi Gohara, Kawasaki (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 443 days.

(21) Appl. No.: 17/389,911

(22) Filed: Jul. 30, 2021

(65) Prior Publication Data
US 2022/0084904 A1  Mar. 17, 2022

(30) Foreign Application Priority Data

Sep. 15, 2020 (JP) ................. 2020-154764

(51) Int. Cl.
*H01L 23/473* (2006.01)
*H01L 25/07* (2006.01)
*H05K 7/20* (2006.01)

(52) U.S. Cl.
CPC .......... *H01L 23/473* (2013.01); *H01L 25/072* (2013.01); *H05K 7/20927* (2013.01)

(58) Field of Classification Search
CPC ............. H01L 21/4878; H01L 21/4882; H01L 23/3121; H01L 23/3142; H01L 23/36; H01L 23/367; H01L 23/3672; H01L 23/3675; H01L 23/3677; H01L 23/3735; H01L 23/041; H01L 23/043; H01L 23/4006; H01L 23/427; H01L 23/46; H01L 23/473; H01L 23/49811; H01L 23/49822; H01L 24/32; H01L 24/73; H01L 25/0655; H01L 25/07; H01L 25/072; H01L 25/18;
(Continued)

(56) References Cited

U.S. PATENT DOCUMENTS

| | | | |
|---|---|---|---|
| 2009/0178788 A1* | 7/2009 | Kimura ................. | H01L 25/112 165/104.33 |
| 2014/0054762 A1* | 2/2014 | Nagaune ............... | H01L 23/473 257/714 |

(Continued)

FOREIGN PATENT DOCUMENTS

| | | |
|---|---|---|
| JP | 2018041978 A | 3/2018 |
| WO | 2013140704 A1 | 9/2013 |

*Primary Examiner* — Amir A Jalali
(74) *Attorney, Agent, or Firm* — Rabin & Berdo, P.C.

(57) ABSTRACT

A cooler includes a top plate having a plurality of fins provided on a surface thereof, and a circumferential wall part provided so as to surround outer circumferences of the plurality of fins along outer circumferential edges of the top plate, and a bottom plate bonded to distal ends of the circumferential wall part and the plurality of fins. A flow path for a coolant is formed by a space enclosed by the top plate, the circumferential wall part and the bottom plate. The bottom plate has inlet and discharge portions for the coolant. The inlet and discharge portions are disposed so as to face each other diagonally with the plurality fins interposed therebetween. An inner surface of the circumferential wall part has a step part that tilts from the inner surface of the circumferential wall part toward the discharge portion at a position neighboring to the discharge portion.

10 Claims, 9 Drawing Sheets

(58) Field of Classification Search
CPC ..... H01L 2023/4031; H01L 2023/4043; H01L 2023/405; H01L 2023/4081; H05K 7/20254; H05K 7/20263; H05K 7/205; H05K 7/20854; H05K 7/20872; H05K 7/209; H05K 7/20926; F28F 9/00; F28F 9/028; F28F 3/00; F28F 3/025; F28F 3/08
See application file for complete search history.

(56) References Cited

U.S. PATENT DOCUMENTS

| | | | |
|---|---|---|---|
| 2016/0343640 A1 | 11/2016 | Gohara et al. | |
| 2019/0279917 A1* | 9/2019 | Gohara | F28F 3/025 |
| 2019/0363036 A1* | 11/2019 | Arai | H05K 7/20254 |
| 2020/0170147 A1* | 5/2020 | Arai | H01L 23/473 |
| 2020/0266126 A1* | 8/2020 | Arai | H05K 7/209 |
| 2021/0313249 A1* | 10/2021 | Matsuzawa | H05K 7/20927 |
| 2021/0335693 A1* | 10/2021 | Yamada | H01L 23/367 |
| 2022/0183194 A1* | 6/2022 | Tateishi | H05K 7/20927 |
| 2022/0278014 A1* | 9/2022 | Tamai | H05K 7/20 |

* cited by examiner

COOLER AND SEMICONDUCTOR APPARATUS

CROSS REFERENCE TO RELATED APPLICATIONS

This application is based upon and claims the benefit of priority of the prior Japanese Patent Application No. 2020-154764, filed on Sep. 15, 2020, the entire contents of which are incorporated herein by reference.

BACKGROUND OF THE INVENTION

Field of the Invention

The resent invention relates to a cooler and a semiconductor apparatus.

Description of the Related Art

A semiconductor apparatus has a substrate having thereon semiconductor elements such as an insulated gate bipolar transistor (IGBT), a power metal oxide semiconductor field effect transistor (MOSFET) and a free wheeling diode (FWD) and is utilized in, for example, an inverter apparatus. In this type of semiconductor module, an apparatus in which a cooler is integrated has been proposed. Semiconductor elements are disposed on a predetermined circuit substrate (which may be called an insulating substrate) and is mounted on a cooler with a bonding material such as solder. The cooler includes a top plate on which semiconductor elements and so on are mounted, heat dissipation fins, a bottom plate, an inlet portion and an outlet portion for a coolant and so on (see Japanese Patent Laid Open No. 2018-41978 and International Publication No. WO 2013/140704, for example). According to Japanese Patent Laid Open No. 2018-41978 and International Publication No. WO 2013/140704, the entire cooler has a rectangular shape in planer view, and the inlet portion and outlet portion for a coolant are provided on diagonal sidewalls with fins interposed therebetween. Heat of the heat dissipation fins caused by an operation of the semiconductor module is dissipated through a coolant that circulates inside the cooler, and the semiconductor elements are thus cooled.

By the way, the coolant flowing within the cooler is discharged from the outlet portion to the outside. The flow quantity of the discharged coolant tends to be large with respect to the size of the cooler. A case is also assumed in which the flow quantity of the coolant has to be increased to increase its cooling effect with an increase in heat value of the semiconductor elements. However, when the flow quantity of the coolant increases, there is a risk that the pressure loss increases in the middle of a flow path for the coolant. Particularly, because an intense quantity of coolant flows near the outlet portion (discharge portion) for the coolant and flows of the coolant thus hit each other, an influence of the increase of the pressure loss tends to be large.

An object of the present invention, which has been made in view of such a point, is to provide a cooler and a semiconductor apparatus by which the pressure loss of a coolant can be reduced.

SUMMARY OF THE INVENTION

A cooler according to one aspect of the present invention includes a top plate, one surface of which serves as a heat dissipation surface, a plurality of fins provided on the heat dissipation surface, a circumferential wall part provided so as to surround outer circumferences of the plurality of fins along outer circumferential edges of the top plate, and a bottom plate bonded to distal ends of the circumferential wall part and the plurality of fins. A flow path for a coolant is formed by a space enclosed by the top plate, the circumferential wall part and the bottom plate, the bottom plate has an inlet portion and a discharge portion for the coolant, the inlet portion and the discharge portion are disposed so as to face each other diagonally with the plurality of fins interposed therebetween, and an inner surface of the circumferential wall part has a step part that tilts from the inner surface of the circumferential wall part toward the discharge portion at a position neighboring to the discharge portion.

A semiconductor apparatus according to another aspect of the present invention includes the aforementioned cooler, and a plurality of semiconductor elements disposed on the other surface of the top plate with an insulating substrate interposed therebetween. The plurality of semiconductor elements are aligned along a longitudinal direction of the cooler.

According to the present invention, the pressure loss of a coolant can be reduced.

DETAILED DESCRIPTION OF THE PREFERRED EMBODIMENT

Figure 1:
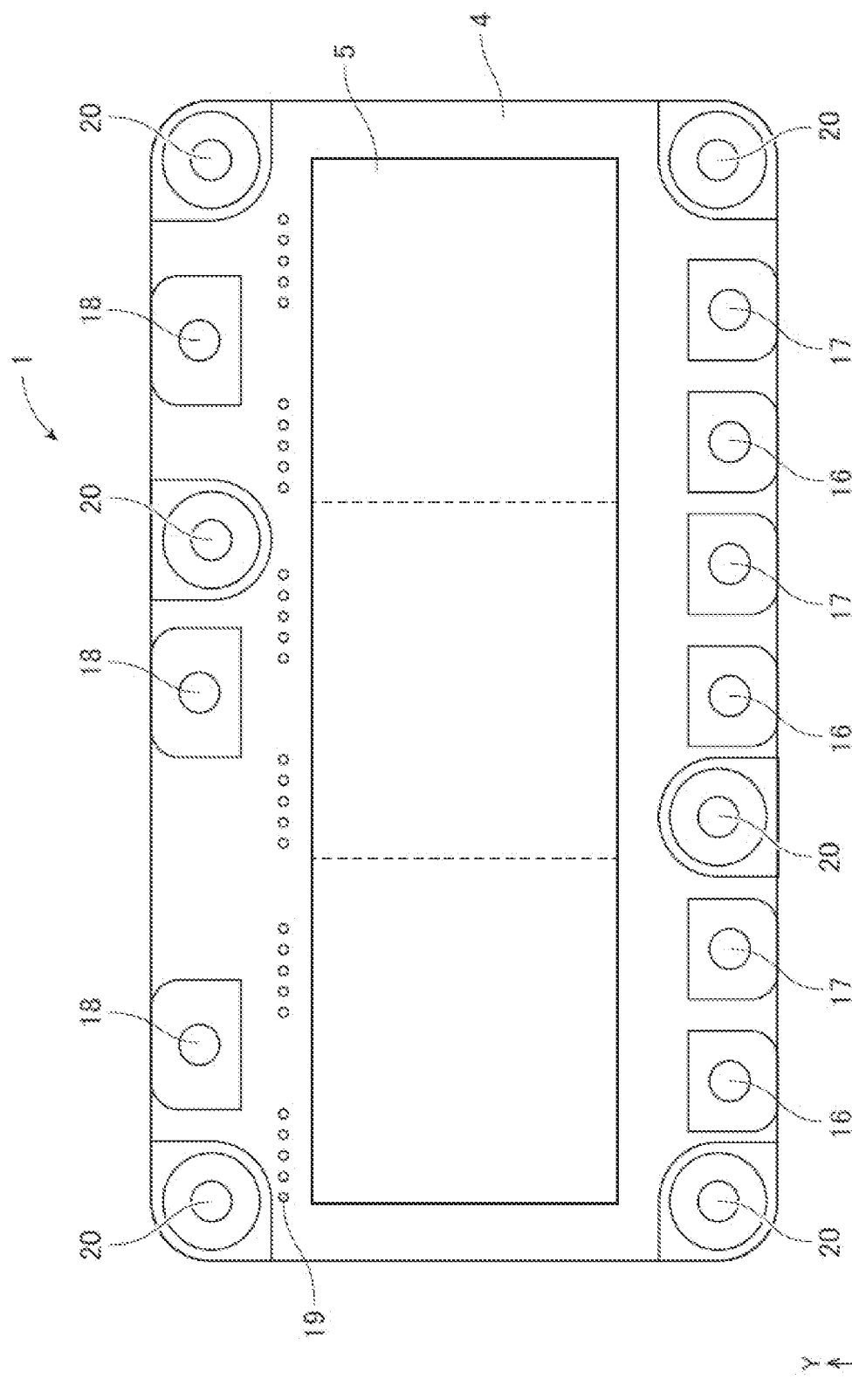
FIG. 1 is a plan view of a semiconductor apparatus according to an embodiment.
Figure 2:
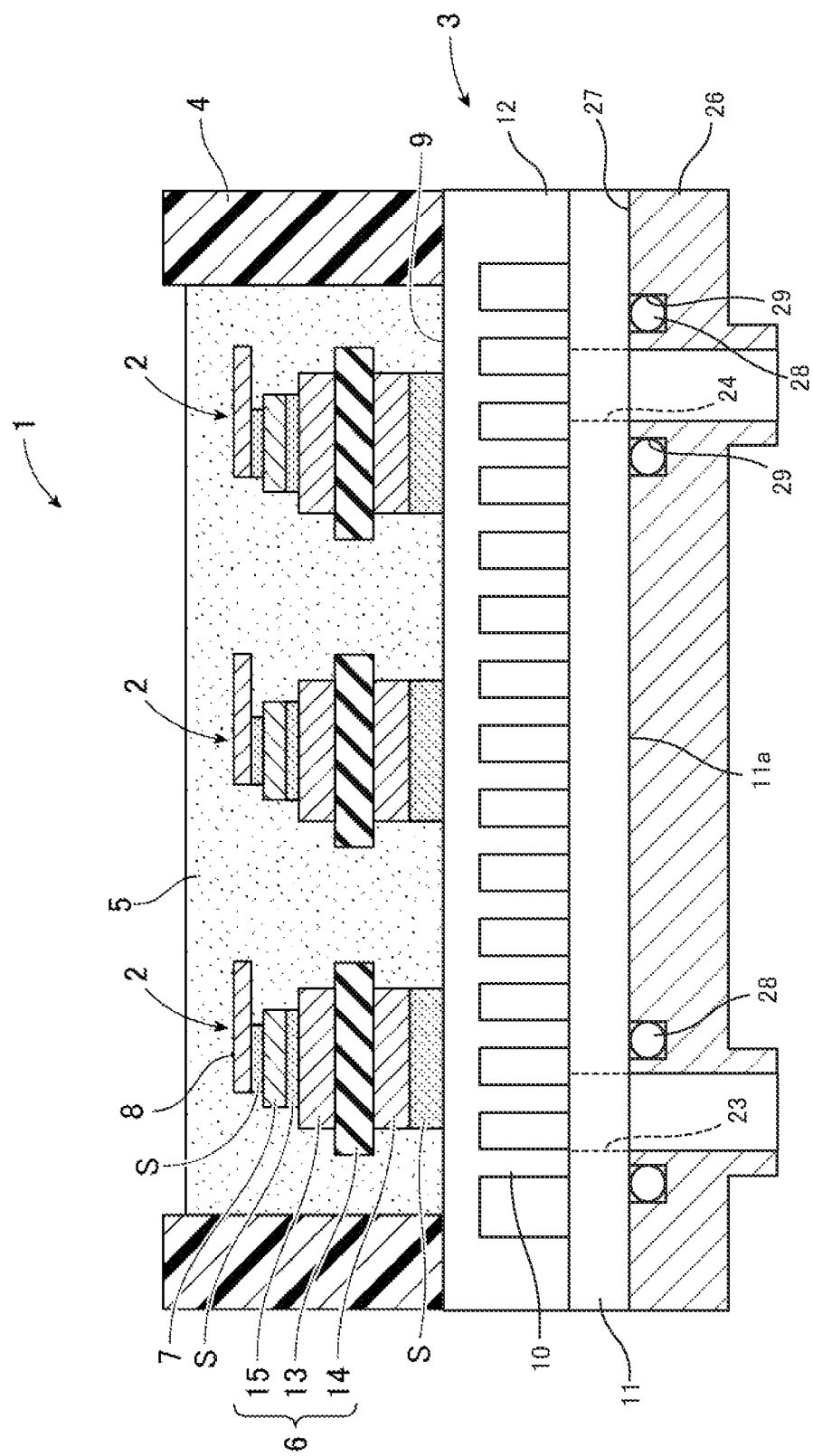
FIG. 2 is a cross-sectional view of the semiconductor apparatus according to the embodiment.
Figure 3:
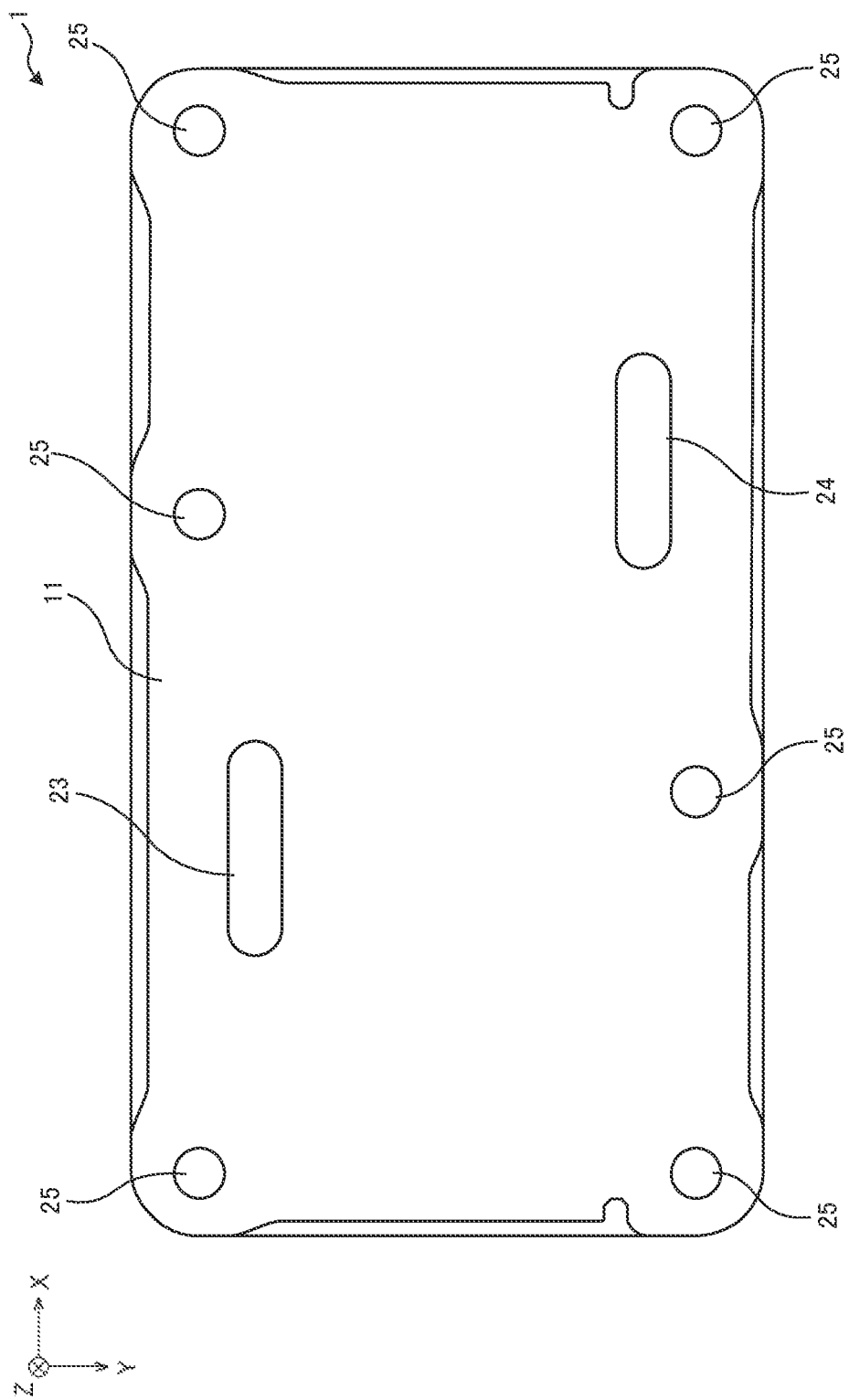
FIG. 3 is a plan view of the semiconductor apparatus (cooler) according to the embodiment viewed from its lower surface side.
Figure 4:
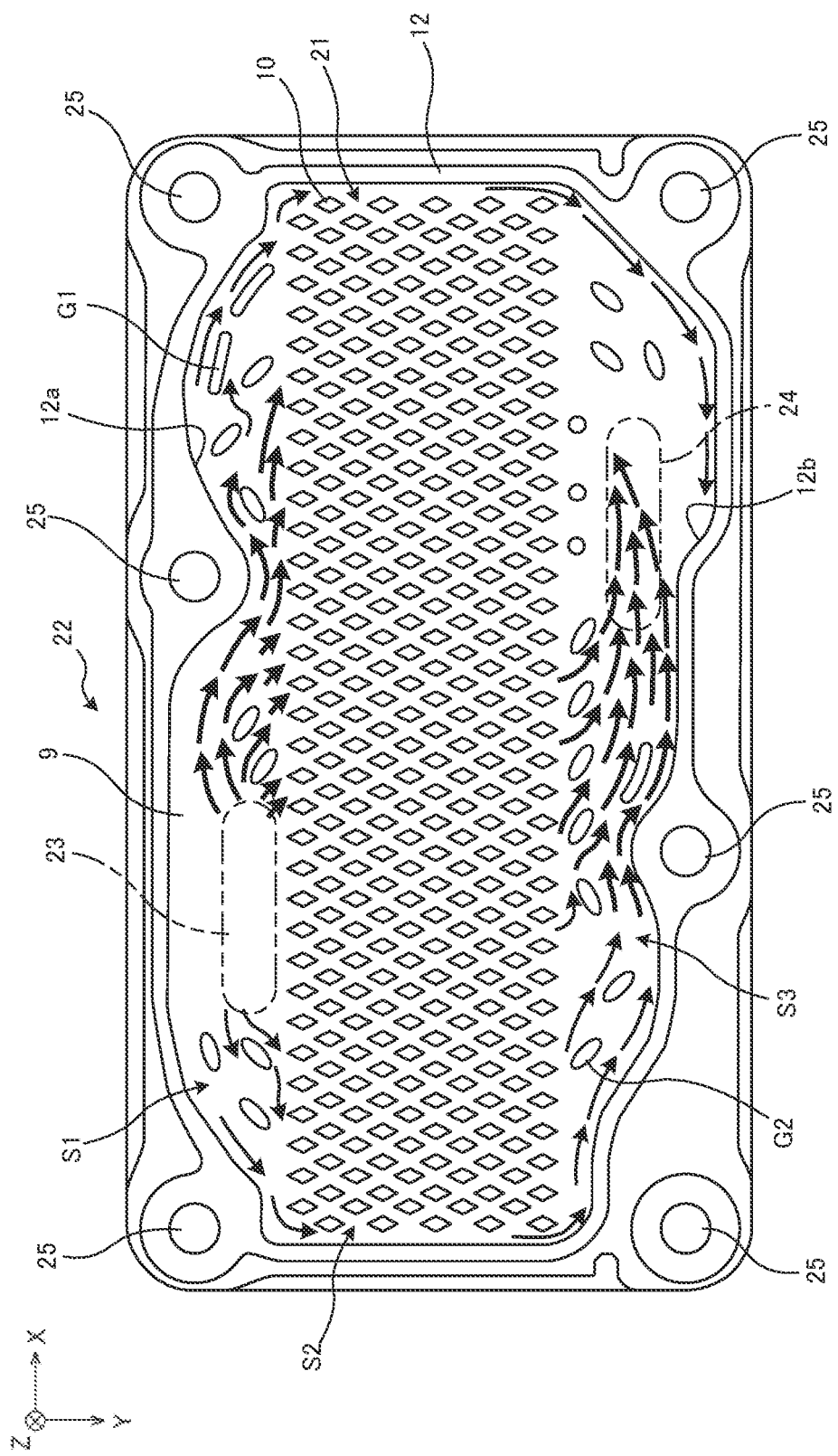
FIG. 4 is a plan view of the cooler shown in FIG. 3 from which a bottom plate thereof is removed.

A semiconductor apparatus to which the present invention is applicable is described below. FIG. 1 is a plan view of a semiconductor apparatus according to an embodiment. FIG. 2 is a cross-sectional view of the semiconductor apparatus according to the embodiment. FIG. 3 is a plan view of the semiconductor apparatus (cooler) according to the embodiment viewed from its lower surface side. FIG. 4 is a plan view of the cooler shown in FIG. 3 from which a bottom plate thereof is removed. The semiconductor apparatus to be described later is merely an example, and changes can be made as required without limiting thereto.

In the following drawings, a longitudinal direction of the semiconductor apparatus (cooler) (or a direction in which a plurality of semiconductor modules are aligned), a transverse direction of the semiconductor apparatus (cooler) and a height direction (direction of thickness of a substrate) are defined as an X direction, a Y direction and a Z direction, respectively. The shown axes of X, Y, Z are orthogonal to each other and form a right-handed system. In some cases, the X direction, the Y direction and the Z direction may be called a right-left direction, a front-back direction and a top-bottom direction, respectively. These directions (front-back, right-left, and top-bottom directions) are words used for convenience of description, and the correspondence relationships with the X, Y, Z directions may change depending on the attached attitude of the semiconductor apparatus. For example, a heat dissipation surface side (cooler side) of the semiconductor apparatus is called a lower surface side, and the opposite side is called an upper surface side. The planer view herein refers to a view in the Z direction of the upper surface or the lower surface of the semiconductor apparatus.

A semiconductor apparatus 1 according to an embodiment is applied to a power converter such as a power module and is a power module included in an inverter circuit. As shown in FIG. 1 to FIG. 4, the semiconductor apparatus 1 includes a plurality of (three in this embodiment) semiconductor modules 2, a cooler 3 that cools the semiconductor modules 2, a case member 4 that accommodates the plurality of semiconductor modules 2, and a sealing resin 5 injected into the case member 4.

Each of the semiconductor modules 2 includes a plurality of insulating substrates 6, a plurality of semiconductor elements 7 disposed on the insulating substrates 6, and a metallic wiring plate 8 disposed on the semiconductor element 7. According to this embodiment, three semiconductor modules 2 are aligned in the X direction. The three semiconductor modules 2 constitute a U phase, a V phase and a W phase from, for example, the X-direction positive side and form a three-phase inverter circuit as a whole. It should be noted that the semiconductor modules 2 may be called power cells.

The cooler 3 has a rectangular shape in planer view and includes a top plate 9, a plurality of fins 10 provided on the top plate 9, and a bottom plate 11. The fins 10 are provided on a surface (heat dissipation surface) of the top plate 9 on the opposite side of a surface (boding surface) to which the insulating substrates 6 are bonded, details of which are described later. The top plate 9 has a circumferential wall part 12 that surrounds outer circumferences of the plurality of fins 10. The bottom plate 11, which is described later, is bonded to distal ends of the plurality of fins 10 and the circumferential wall part 12.

The insulating substrates 6 are disposed on the upper surface of the top plate 9 with a bonding material S such as solder. The insulating substrates 6 are composed of, for example, a direct copper bonding (DCB) substrate, an active metal brazing (AMB) substrate or a metallic base substrate. More specifically, the insulating substrates 6 have an insulating plate 13, a heat dissipation plate 14 disposed on a lower surface of the insulating plate 13, and a circuit plate 15 disposed on an upper surface of the insulating plate 13. The insulating substrates 6 have, for example, a rectangular shape in planer view.

The insulating plate 13 is formed by, for example, an insulating material such as a ceramics material such as alumina ($Al_2O_3$), aluminum nitride (AlN) or silicon nitride ($Si_3N_4$), or a resin material such as epoxy, or an epoxy resin material having a ceramics material as a filler. It should be noted that the insulating plate 13 may be called an insulating layer or an insulating film.

The heat dissipation plate 14 has a predetermined thickness in the Z direction and is formed so as to cover the entire lower surface of the insulating plate 13. The heat dissipation plate 14 is formed by a metallic plate having good heat conductivity of, for example, copper or aluminum.

The circuit plate 15 is provided on the upper surface of the insulating plate 13. Although FIG. 2 shows only one circuit plate 15 for convenience of description, more circuit plates 15 may be formed on the upper surface of the insulating plate 13. These circuit plates 15 are metallic layers of, for example, a copper foil and are formed in land shapes on the insulating plate 13 such that the circuit plates 15 are electrically insulated from each other.

The semiconductor element 7 is disposed on the upper surface of the circuit plate 15 with the bonding material S such as solder. The semiconductor element 7 is, for example, square-shaped in planer view. The semiconductor element 7 is disposed at a position corresponding to the plurality of fins 10, details of which are described below.

The semiconductor element 7 is disposed on the upper surface of the circuit plate 15 with the bonding material S and is electrically connected thereto. Although FIG. 2 shows one semiconductor element 7 for one circuit plate 15 for convenience, more semiconductor elements 7 may be disposed on the circuit plate 15. The semiconductor element 7 is square-shaped (rectangular-shaped) in planer view and is formed by a semiconductor substrate of, for example, silicon carbide (SiC), gallium nitride (GaN) or diamond.

As the semiconductor element 7, an insulated gate bipolar transistor (IGBT), a switching element such as a power metal oxide semiconductor field effect transistor (MOSFET), or a diode such as a free wheeling diode (FWD) is used. Alternatively, as the semiconductor element 7, a reverse conducting (RC)—IGBT element in which an IGBT and an FWD are integrated, a power MOSFET element, a reverse blocking (RB)—IGBT having a sufficient resistance to pressure against a reverse bias or the like may be used.

The shape, number of positions or positions of the semiconductor elements 7 can be changed as required. Although the semiconductor element 7 according to this embodiment is a vertical switching element having a function element such as a transistor on the semiconductor substrate, the semiconductor element 7 is not limited thereto and may be a horizontal switching element.

The metallic wiring plate 8 is disposed on an upper surface electrode of the semiconductor element 7 with the bonding material S such as solder. The metallic wiring plate 8 forms main wiring through which main current flows. The metallic wiring plate 8 is formed by, for example, press processing by using a metallic material such as a copper material, a copper-alloy-based material, an aluminum-alloy-based material or an iron-alloy-based material. The metallic wiring plate 8 has one end bonded to the upper surface electrode of the semiconductor element 7. The metallic wiring plate 8 has the other end, not particularly shown, bonded to an external terminal provided in the case member, which is described later. The shape of the metallic wiring plate 8 shown in FIG. 2 is merely an example and can be changed as required. The metallic wiring plate 8 may be, for example, a lead frame, a clip or a ribbon.

The case member 4 is bonded to the upper surface of the top plate 9 with, for example, an adhesive (not shown). The case member 4 has a shape following an external shape of the top plate 9 of the cooler 3. The case member 4 has a rectangular frame shape that is open at its center. The aforementioned three semiconductor modules 2 are accommodated in the central opening. In other words, the three semiconductor modules 2 are surrounded by the frame-shaped case member 4.

The sealing resin 5 is filled in an inner space of the case member 4, details of which are described later. In other words, the case member 4 defines a space that accommodates the plurality of semiconductor modules 2 (the insulating substrates 6, the semiconductor elements 7 and the metallic wiring plates 8) and the sealing resin 5. This case member 4 is formed of a thermoplastic resin. The case member 4 is formed of, for example, a polyphenylene sulfide resin (PPS resin), a polybutylene terephthalate resin (PBT resin) or the like.

Main terminals (a P terminal 16, an N terminal 17, and an M terminal 18) for external connection and a control terminal 19 for control are provided in the case member 4. More specifically, the P terminal 16 and the N terminal 17 are embedded by molding in a wall part on the Y-direction negative side of a pair of wall parts that face each other in the transverse direction (Y direction) of the case member 4. One P terminal 16 and one N terminal 17 are provided for one semiconductor module 2.

The M terminal 18 and the control terminal 19 are embedded by molding in a wall part on the Y-direction positive side of the pair of wall parts that face each other in the transverse direction (Y direction) of the case member 4. One M terminal 18 is provided for one semiconductor module 2. For example, 10 control terminals 19 are provided for one semiconductor module 2.

These terminals are formed of a metallic material such as a copper material, a copper-alloy-based material, an aluminum-alloy-based material or an iron-alloy-based material. The shapes, positions and numbers of those terminals are not limited to those described above but can be changed as required.

The case member 4 has a plurality of through-holes 20 along an outer edge of the case member 4. The through-holes 20 are holes for inserting screws (not shown) therethrough for fixing the semiconductor apparatus 1.

As described above, the sealing resin 5 is filled in an internal space provided by the frame-shaped case member 4. Thus, the insulating substrates 6, and the semiconductor elements 7 and the metallic wiring plates 8 mounted thereon are sealed within the space. The sealing resin 5 is formed of a thermosetting resin. The sealing resin 5 preferably contains at least one of epoxy, silicone, urethane, polyimide, polyamide, and polyamide-imide. As the sealing resin 5, for example, an epoxy resin to which a filler is mixed is preferable from viewpoint of its insulation property, heat resistance property and heat dissipation property.

Next, a detailed configuration of the cooler 3 is described. As shown in FIG. 2 to FIG. 4, the cooler 3 has a box shape formed by bonding the bottom plate 11 to the top plate 9 and integrating them. The cooler 3 is formed of, for example, an aluminum alloy having a good heat dissipation property. A plating layer having a predetermined thickness is provided on a surface of the cooler 3. The plating layer is preferably formed of metallic plating of, for example, nickel.

The top plate 9 is rectangular-shaped in planer view and is formed by a plate-shaped body having a predetermined thickness. The top plate 9 has an external shape corresponding to the external shape of the case member 4. In other words, the top plate 9 has a longitudinal direction extending in the right-left direction (X direction) of the semiconductor apparatus 1 and a transverse direction extending in the front-back direction (Y direction) of the semiconductor apparatus 1. The top plate 9 has one surface (lower surface) and the other surface (upper surface). The one surface forms a heat dissipation surface of the semiconductor modules 2. The other surface forms a bonding surface of the semiconductor modules 2.

According to this embodiment, three semiconductor modules 2 are disposed in a central area of the upper surface of the top plate 9. As described above, the three semiconductor modules 2 are aligned in the X direction. It should be noted that, according to this embodiment, the central area of the lower surface side (heat dissipation surface side) of the top plate 9 on which the three semiconductor modules 2 described above are disposed is sometimes called a heat dissipation area.

The plurality of fins 10 are provided in the heat dissipation area of the lower surface of the top plate 9. The plurality of fins 10 are disposed along the longitudinal direction of the top plate. The plurality of fins 10 may be formed of the same metallic material as the top plate 9 and may be provided integrally with the top plate 9. In other words, the fins 10 are used as a heat sink. For example, as the fins 10, pin fins can be used in which a plurality of prism-shaped pins (square pins) are arranged at predetermined pitches with an interval therebetween, as shown in FIG. 3.

More specifically, each of the fins 10 has a rhombus shape in planer view, and the facing direction where a pair of corners face each other on a diagonal line agrees with the transverse direction of the top plate 9. The fins 10 project by a predetermined length toward the Z-direction negative side. The configuration of the fins 10 provided on the top plate 9 is not limited thereto but can be changed as required. For example, cylindrical-shaped pins may be provided instead of the prism-shaped pins shown in FIG. 3, or a plurality of fins 10 having a blade shape extending in the front-back direction may be aligned in parallel with each other. The fins 10 may be provided to the top plate 9 by brazing, implanting, cutting processing or plastic working.

According to this embodiment, a collection 21 of the plurality of fins 10 is provided. The collection 21 of the fins 10 has an external shape having a substantially rectangular parallelepiped shape. More preferably, although the external shape of the collection 21 of the fins 10 is a rectangular parallelepiped shape, it is not limited thereto and may be rounded or deformed. The longitudinal direction of the collection 21 of the fins 10 agrees with the longitudinal direction of the top plate 9.

The lower surface of the top plate 9 has the circumferential wall part 12 that surrounds an outer circumference of the plurality of fins 10 (collection 21). The circumferential wall part 12 projects by a predetermined height from the lower surface of the top plate 9 toward the Z-direction negative side. The circumferential wall part 12 has a rectangular frame shape along the outer edge of the top plate 9. The projection height of the circumferential wall part 12 is preferably equal to the projection height of the fins 10.

The top plate 9 and the circumferential wall part 12 may be integrated with each other. In other words, the top plate 9 and the circumferential wall part 12 form a box-shaped cooling case 22 that is open downward. The bottom plate 11, which is described below, forms a lid part that closes the opening of the cooling case 22.

The bottom plate 11 is disposed on a lower surface of the cooling case 22 described above. The bottom plate 11 has the same rectangular shape in planer view as the top plate 9 and is formed as a plate-shaped body having a predetermined thickness. The bottom plate 11 is preferably formed of an aluminum alloy that is the same material as the cooling case 22.

The bottom plate 11 is bonded to distal ends of the circumferential wall part 12 and the plurality of fins 10 described above by brazing. Thus, the lower opening of the cooling case 22 is closed. In this way, a flow path for a coolant is formed by the space enclosed by the top plate 9, the plurality of fins 10, the circumferential wall part 12, and the bottom plate 11.

The space enclosed by the top plate 9, the circumferential wall part 12, and the bottom plate 11 is divided into three spaces (a first header part S1, a fin accommodating part S2 and a second header part S3). More specifically, the first header part S1 forms a space leading to an inlet portion 23 for a coolant, which is described later. The fin accommodating part S2 forms a space in which the plurality of fins 10 described above are accommodated. The second header part S3 forms a space leading to a discharge portion 24 for the coolant, which is described later.

The first header part S1 and the second header part S3 are disposed so as to face each other with the fin accommodating part S2 interposed therebetween in the Y direction (the transverse direction of the top plate). In other words, the first header part S1 forms a coolant flow path on an upstream side of the fin accommodating part S2, and the second header part S3 forms a coolant flow path on a downstream side of the fin accommodating part S2. Liquid was used as the coolant. Various kinds of liquid can be used as the coolant.

The first header part S1 and the second header part S3 have a plurality of guide walls G1 and G2, respectively, that guide flows of the coolant, details of which are described below. The plurality of guide walls G1 and G2 extend in the Z direction within the space and have a blade shape extending along a predetermined direction in planer view. The plurality of guide walls G1 and G2 may be formed of, for example, the same metallic material as the top plate 9 and may be integrally provided to the top plate 9. The plurality of guide walls G1 and G2 may be provided on the top plate 9 by brazing, implanting, cutting processing or plastic working. The bottom plate 11 described above is also bonded to distal ends of the plurality of guide walls G1 and G2 by, for example, brazing. With these guide walls G1 and G2, flows of the coolant can be controlled.

As shown in FIG. 4, the inlet portion 23 and the discharge portion 24 for the coolant to and from the cooler 3 are provided at predetermined positions of the bottom plate 11. Each of the inlet portion 23 and the discharge portion 24 has a through-hole extending through the bottom plate 11 in the thickness direction. More specifically, the inlet portion 23 and the discharge portion 24 are disposed so as to face each other diagonally with the plurality of fins 10 interposed therebetween in the Y direction. Each of the inlet portion 23 and the discharge portion 24 has a long-hole shape that is long in the X direction in planar view. For example, the shape of the inlet portion 23 and the discharge portion 24 is an elliptical shape that is short on the transverse direction side of the cooler 3 and is long on the longitudinal direction side. The shapes and positions of the inlet portion 23 and discharge portion 24 are not limited thereto but can be changed as required, details of which are described later.

The cooler 3 has a plurality of fixing holes 25 along the outer circumferential edge. The fixing holes 25 are provided correspondingly to the through holes 20 of the case member 4 described above.

In the first header part S1, the inlet portion 23 is deviated to the X-direction negative side. On the other hand, in the second header part S3, the discharge portion 24 is deviated to the X-direction positive side. The first header part S1 has the fixing hole 25 described above at a substantially center part in the X direction. Thus, the inner surface of the circumferential wall part 12 forming the first header part S1 has a curved shape that bypasses the fixing hole 25.

As shown in FIG. 4, in planer view, in the first header part S1, the inner surface of the circumferential wall part 12 positioned in vicinity of the fixing hole 25 positioned at the substantial center in the X direction is curved inward on the Y-direction negative side. On the other hand, in the first header part S1, an inner surface 12a of the circumferential wall part 12 that faces the discharge portion 24 with the plurality of fins 10 interposed therebetween is curved outward on the Y direction positive side. More specifically, in the first header part S1, the inner surface 12a of the circumferential wall part 12 positioned on the X-direction positive side with respect to the fixing hole 25 positioned at the substantially center in the X direction is curved so as to have an arc shape. Around the curved circumferential wall part 12, the plurality of guide walls G1 are disposed along the inner surface 12a of the circumferential wall part 12.

In the second header part S3, the inner surface of the circumferential part 12 has a step part 12b at a position corresponding to the discharge portion 24, details of which are described below. The step part 12b is disposed so as to overlap the discharge portion 24 viewed from the transverse direction (Y direction) of the top plate 9. Furthermore, the step part 12b tilts at a predetermined angle diagonally in planer view, and the width of the second header part S3 in the Y direction increases as the distance from the inlet portion 23 increases.

The semiconductor apparatus 1 having the configuration as described above is attached to a flat attachment surface 27 of a flange 26 having a connection portion for a hose with a gasket such as an O-ring 28 interposed therebetween. In this case, the lower surface 11a of the bottom plate 11 is in contact with the attachment surface 27. Referring to FIG. 2, for example, the flange 26 has a groove 29 for the O-ring. Because of the O-ring 28, the sealing between the attachment surface 27 and the lower surface 11a of the bottom plate 11 is acquired.

By the way, in the semiconductor apparatus integrated with the cooler, the cooler is provided below semiconductor elements being a heating source. Particularly, heat dissipation fins for heat dissipation are provided at positions immediately below the semiconductor elements. The inlet portion and discharge portion for a coolant are provided on the upstream side and downstream side of the space in which the heat dissipation fins are accommodated within the cooler.

The coolant is introduced from the inlet portion to the inside of the cooler and is discharged from the discharge portion to the outside of the cooler through the heat dissipation fins. The flow quantity of the coolant to be discharged tends to be large with respect to the size of the cooler. A case is also assumed in which the flow quantity of the coolant has to be increased for increasing its cooling effect with an increase in heat value of the semiconductor elements. However, when the flow quantity of the coolant increases, there is a risk that the pressure loss increases in the middle of the flow path for the coolant. Particularly, because an intense quantity of coolant flows in vicinity of the outlet portion (discharge portion) for the coolant and flows of the coolant thus hit each other, an influence of the increase of the pressure loss tends to be large.

Generally, from a viewpoint of cooling, the flow of the coolant is preferably a turbulent flow rather than a laminar flow. This is because the coolant is shaken up by the turbulent flow, so that the number of times of contact of the coolant with the dissipation surface increases and a higher heat dissipation effect can be acquired. On the other hand, from a viewpoint of easy flow of the coolant, the flow of the coolant is preferably a laminar flow rather than a turbulent flow. This is because the turbulent flow increases the pressure loss described above, which prevents the coolant from easily and smoothly flowing as a result.

At first glance, in the cooler, there is a tradeoff relationship between the cooling effect and the easy flow of the coolant. However, it is not true, and the cooler 3 applied to the semiconductor apparatus 1 separately has a position where cooling should be promoted and a position where smoother flow of the coolant is desired.

More specifically, it can be said that the heat dissipation area in which the semiconductor element 7 being a heat source is disposed is the position where cooling should be more actively promoted. In other words, the fin accommodating part S2 is the position where cooling should be promoted and is a space where a turbulent flow of the coolant is desirable. On the other hand, it can be said that the inlet portion 23 and discharge portion 24 provided at positions off the heat source are positions where smoother flow of the coolant is desired instead of promotion of the cooling. In other words, the first header part S1 and the second header part S3 are positions where smoother flow of the coolant is desired and are spaces where a laminar flow of the coolant is desired.

In this way, the inventor of the subject application has reached the present invention by focusing on the flow of the coolant in vicinity of the entrance and exit for the coolant, particularly, the discharge portion 24, which is considered as having an increased flow quantity of the coolant. The specific configuration is described below.

Figure 5:
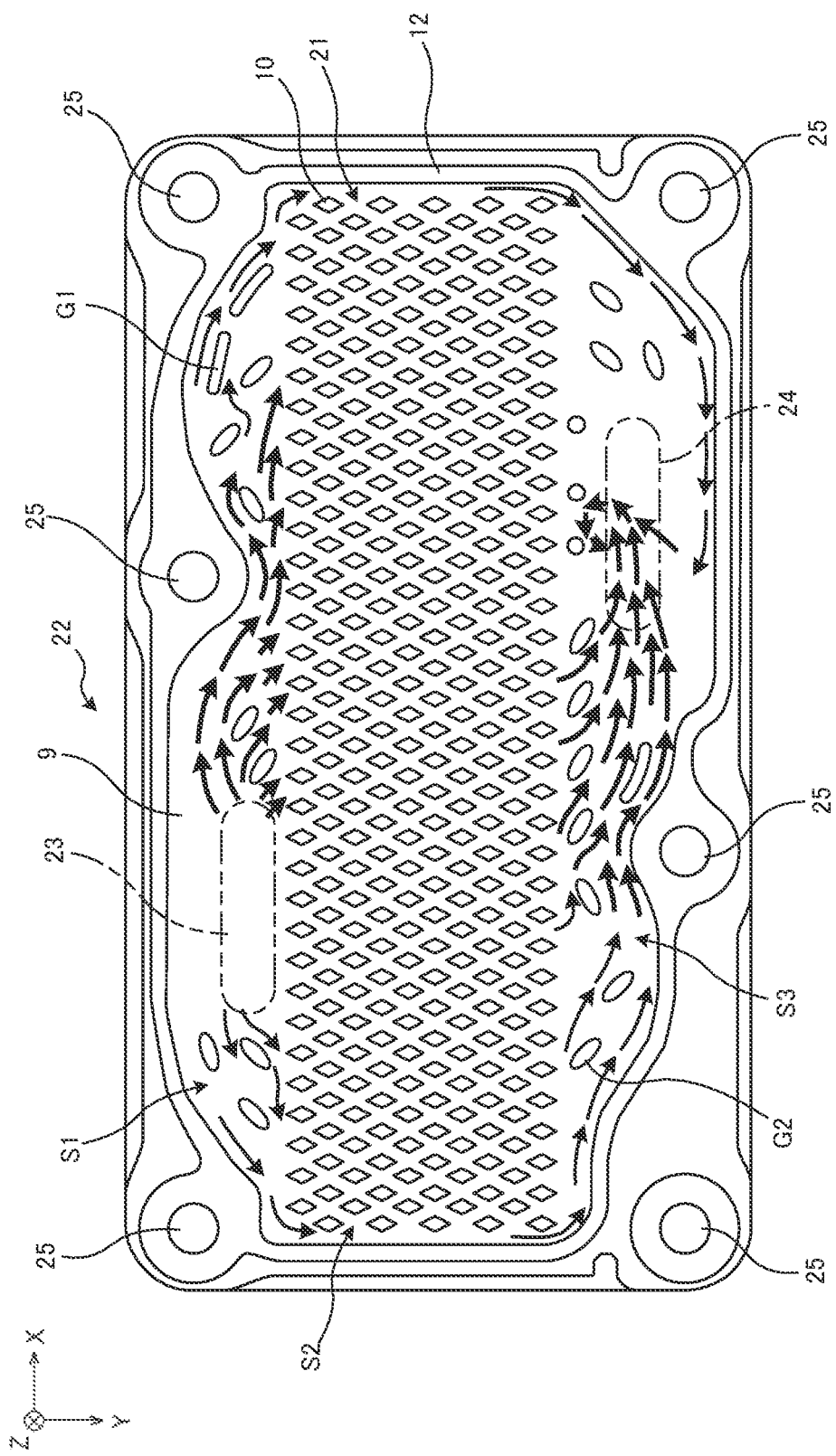
FIG. 5 is a plan view corresponding to FIG. 4 of a semiconductor apparatus according to a comparative example.

Now, a flow of the coolant around the discharge portion is described with reference to FIGS. 4 and 5. FIG. 5 is a plan view corresponding to FIG. 4, of a semiconductor apparatus according to a comparative example. FIG. 5 is different from FIG. 4 in that the step part 12b (see FIG. 4), which is a characteristic of the subject application and is described later, is not provided in vicinity of the discharge portion 24. For that, like numbers refer to like parts in FIG. 4 and FIG. 5, and repetitive description is omitted accordingly. In FIG. 4 and FIG. 5, flows of the coolant are indicated by arrows having different thicknesses. The thicknesses of the arrows indicate the magnitudes of the flow rates of the coolant. In other words, as the arrow thickness increases, the flow rate of the coolant increases.

As shown in FIG. 4 and FIG. 5, the coolant flowing from the inlet portion 23 into the first header part S1 flows toward both sides in the X direction (right-left direction) that is the longitudinal direction. On the left side of the inlet portion 23, there are a coolant flowing toward the downstream side along the circumferential wall part 12 and a coolant flowing toward the downstream side through gaps between the plurality of fins 10.

Similarly on the right side of the inlet portion 23, there are a coolant flowing toward the downstream side along the circumferential wall part 12 and a coolant flowing toward the downstream side through gaps between the plurality of fins 10. Particularly on the right side of the inlet portion 23, because the fixing holes 25 are provided in the middle, the width in the Y direction of the first header part S1 partially decreases. Thus, there is a risk that the resistance of the flow path increases in vicinity of the fixing holes 25 and the coolant does not easily flow.

However, according to this embodiment, as described above, the inner surface 12a of the circumferential wall part 12 is curved outward on the downstream side of the first header part S1. In other words, the first header part S1 where the curved inner surface 12a is positioned has a partially large width in the Y direction. Thus, the coolant can smoothly flow within the wide first header part S1 along the inner surface 12a without retention of the coolant in vicinity of the fixing hole 25. Therefore, the coolant can also flow to the first header part S1 positioned on the X-direction positive side relatively away from the inlet portion 23. As a result, the coolant flows into the entire area in the X direction of the collection 21 of the fins 10, and the heat dissipation effect of the entire heat dissipation area can be increased.

The coolant having passed through the fin accommodating part S2 particularly has the highest flow rate at the substantially central part in the X direction of the second header part S3 and flows from the central part into the discharge portion 24 on the right side. At the same time, the coolant flowing along the right and left parts of a circumferential wall part 12 in the fin accommodating part S2 also flows toward the discharge portion 24 along the inner surfaces of the circumferential wall part 12 also in the second header part S3.

Here, as shown in FIG. 5, in the comparative example, the step part 12b does not exist in vicinity of the discharge portion 24. Therefore, the coolant having a relatively high flow rate at the center in the X direction in the second header part S3 is merged with the coolant flowing along the left part of the circumferential wall part 12 and thus thrown up in vicinity of the discharge portion 24. As a result, in the comparative example shown in FIG. 5, a swirl occurs in vicinity of the discharge portion 24. Hence, because of an increase of the pressure loss, a situation occurs in which the coolant is retained and cannot be smoothly discharged in vicinity of the discharge portion 24.

On the other hand, according to the embodiment shown in FIG. 4, the inner surface of the circumferential wall part 12 in the second header part S3 has the step part 12b at the position corresponding to the discharge portion 24. The step part 12b is disposed so as to overlap the discharge portion 24 viewed from the transverse direction (Y direction) of the top plate 9. Furthermore, the step part 12b tilts at a predetermined angle diagonally in planer view, and the width of the second header part S3 in the Y direction increases as the distance from the inlet portion 23 increases.

With this configuration, because the step part 12b is positioned in vicinity of the discharge portion 24, the coolant flowing along the left part of the circumferential wall part 12 is guided to the Y-direction positive side along the tilting surface of the step part 12b and is smoothly merged with the coolant having a high flow rate. In other words, the coolant having a relatively high flow rate at the center of the second header part S3 in the X direction does not easily catch the surrounding coolant when the coolant flowing along the left part of the circumferential wall part 12 is merged therewith.

More specifically, because, in the case in FIG. 5, an open space occurs at the position where flows of the coolant are merged, the coolant in vicinity of the merging point is easily caught. On the other hand, because, in the case in FIG. 4, the position having the step part 12b is the merging point, a space that is open to the surroundings does not exist unlike the case in FIG. 5. As a result, it can be said that the catch of the coolant in vicinity of the merging point is suppressed. Therefore, in the case in FIG. 4, because the swirl is smaller than that in FIG. 5, the pressure loss of the coolant can be reduced, and smooth discharge of the coolant can be realized.

Figure 6:
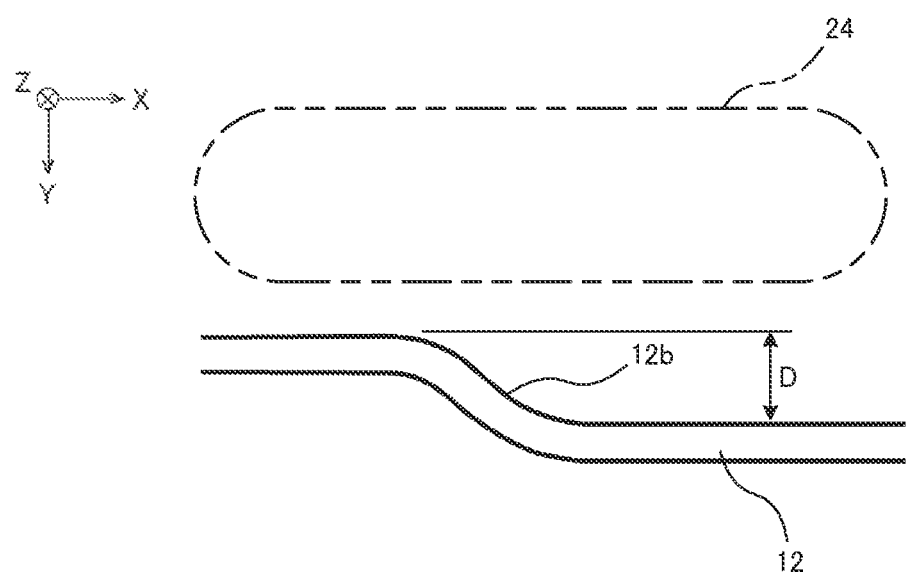
FIG. 6 is a partially enlarged view of a part around a discharge portion shown in FIG. 4.
Figure 7:
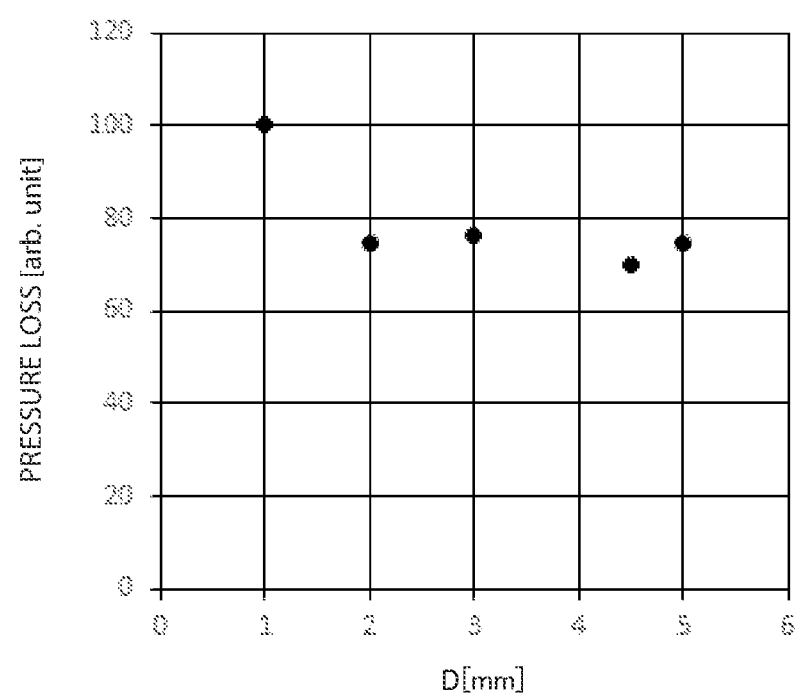
FIG. 7 is a graph showing a relationship between a width of a step and a pressure loss.
Figure 8:
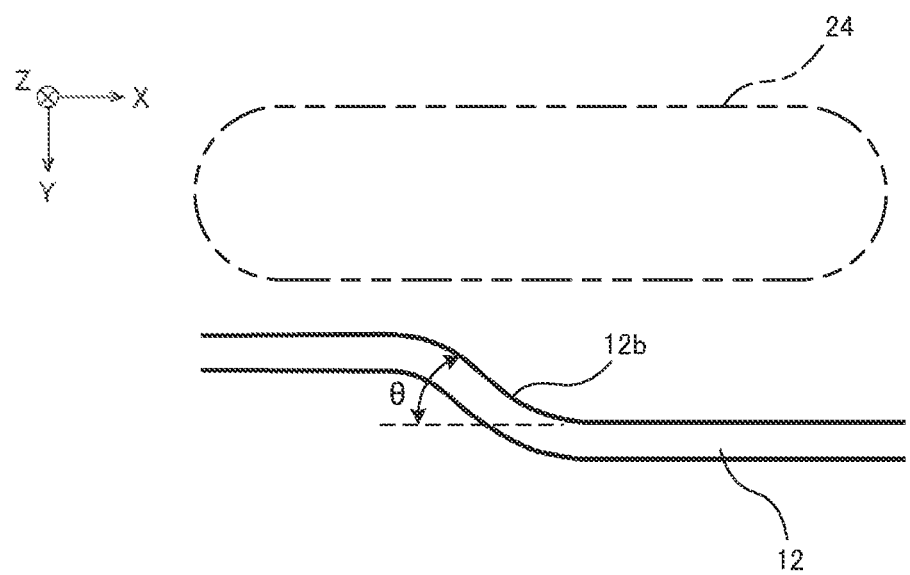
FIG. 8 is a partially enlarged view of the part around the discharge portion shown in FIG. 4.
Figure 9:
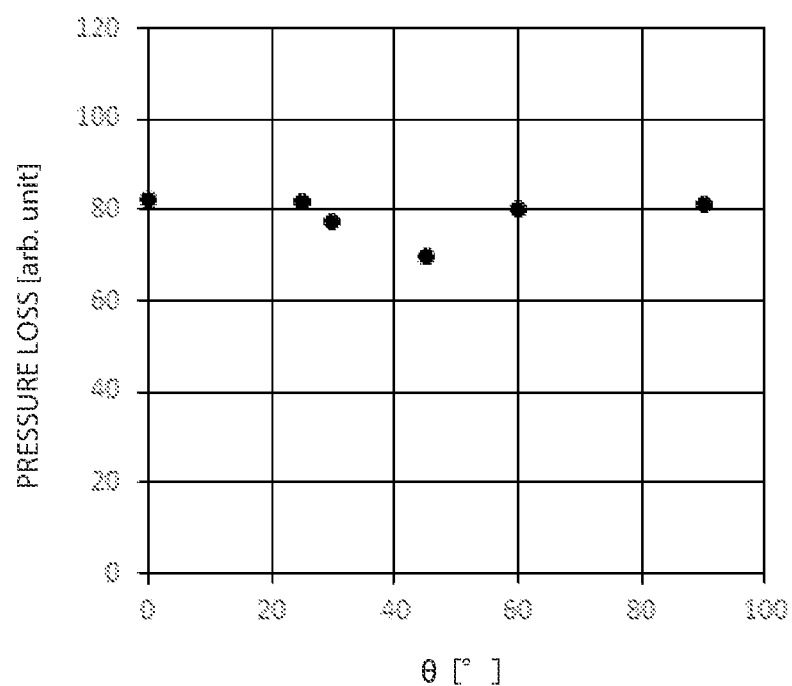
FIG. 9 is a graph showing a relationship between an angle of the step and the pressure loss.
Figure 10:
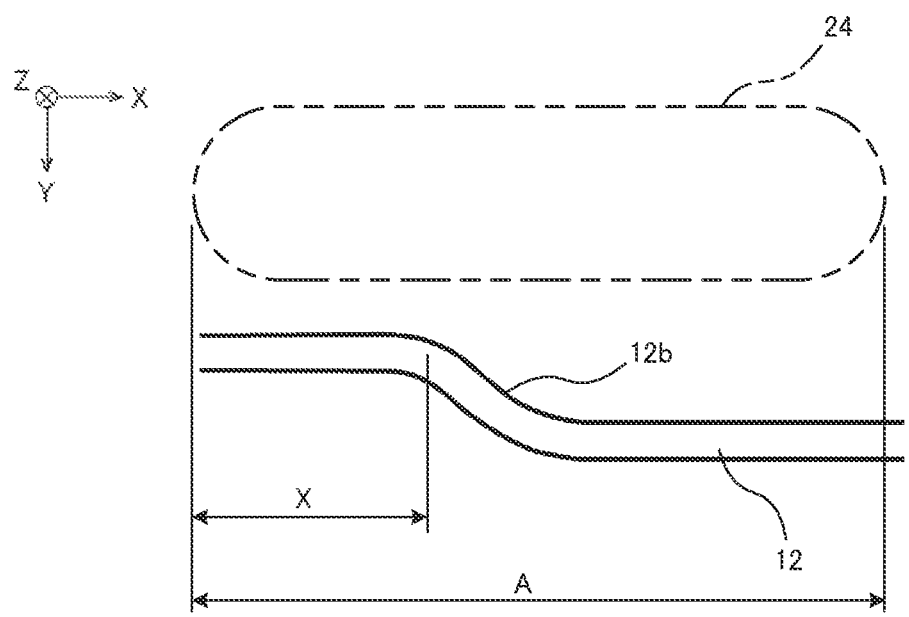
FIG. 10 is a partially enlarged view of the part around the discharge portion shown in FIG. 4.
Figure 11:
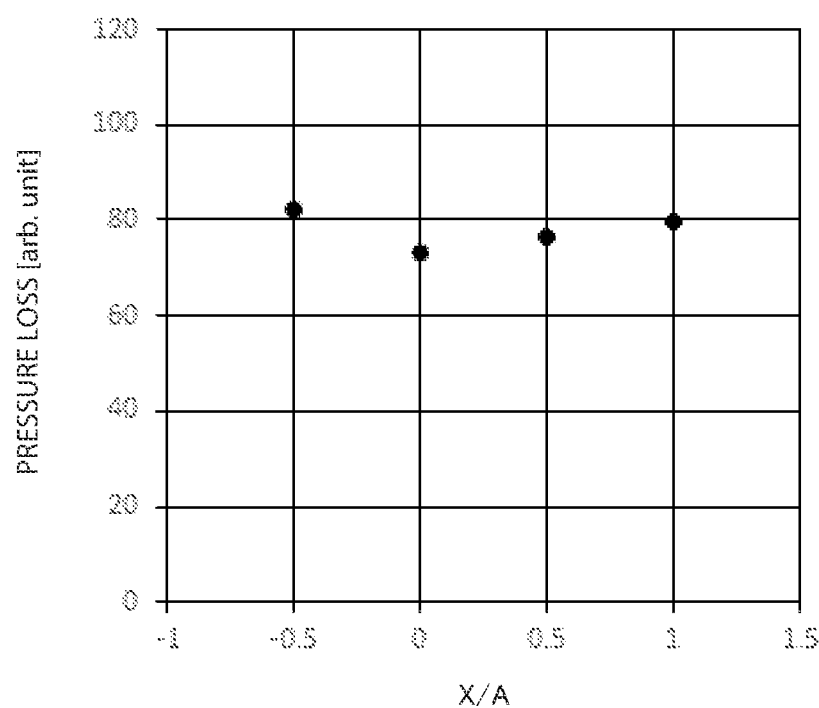
FIG. 11 is a graph showing a relationship between a position of the step with respect to the discharge portion and the pressure loss.
Figure 12:
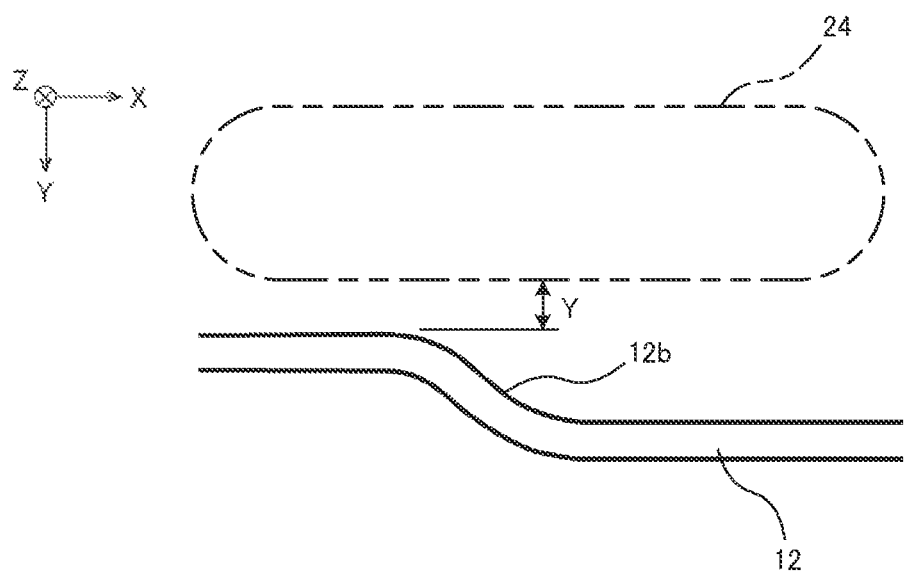
FIG. 12 is a partially enlarged view of the part around the discharge portion shown in FIG. 4.
Figure 13:
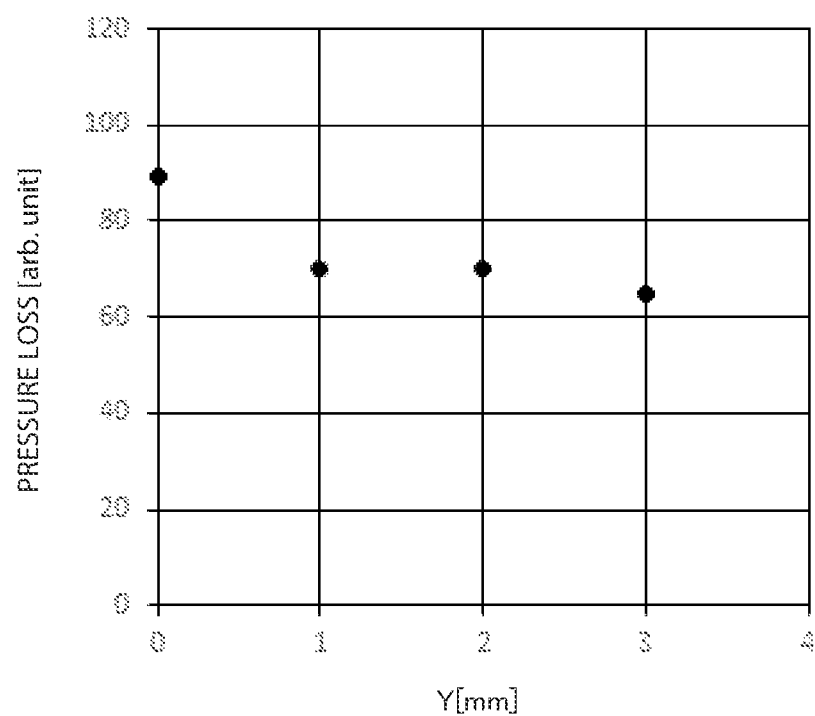
FIG. 13 is a graph showing a relationship between a distance from a circumferential wall part to the discharge portion and the pressure loss.

Next, with reference to FIG. 6 to FIG. 13, a relationship between the step part and the pressure loss is described by using a plurality of parameters. FIGS. 6, 8, 10 and 12 are partially enlarged views of a part around the discharge portion shown in FIG. 4. FIG. 7 is a graph showing a relationship between the width of the step part and the pressure loss. FIG. 9 is a graph showing a relationship between the angle of the step part and the pressure loss. FIG. 11 is a graph showing a relationship between the position of the step part with respect to the discharge portion and the pressure loss. FIG. 13 is a graph showing the distance from the circumferential wall part to the discharge portion and the pressure loss. The graphs in FIGS. 7, 9, 11 and 13 have horizontal axes indicating the respectively corresponding parameters and a vertical axis indicating the pressure loss.

As shown in FIGS. 6 and 7, when the predetermined parameter is a width D of the step part 12b in the transverse direction (Y direction) of the top plate 9, the width D is preferably equal to or larger than 2 mm and equal to or smaller than 5 mm. As shown in the graph in FIG. 7, it is understood that when the width D is, for example, 1 mm, the pressure loss is relatively large while, when the width D is in a range of 2 mm to 5 mm, the pressure loss is reduced.

As shown in FIGS. 8 and 9, when the predetermined parameter is a tilt angle θ of the step part 12b, the tilt angle θ is preferably larger than 25° and smaller than 60°. More preferably, the tilt angle θ is 45°. As shown in the graph in FIG. 9, it is understood that when the tilt angle θ is equal to or smaller than 25° or equal to or larger than 60°, the pressure loss is relatively large while when the tilt angle θ is in a range of 25° to 60°, the pressure loss is reduced. When the tilt angle θ is 45°, the pressure loss is the smallest.

As shown in FIGS. 10 and 11, when the predetermined parameter is a ratio (X/A) between the position of the step part 12b with respect to the discharge portion 24 and the width in the longitudinal direction of the discharge portion 24 where X is a distance from the left end of the discharge portion 24 to the starting position of the step part 12b and A is a length (width) in the X direction of the discharge portion 24, the ratio (X/A) is preferably larger than or equal to 0 and equal to or lower than 1. As shown in the graph in FIG. 11, it is understood that when X/A is lower than 0, the pressure loss is relatively large while when X/A is in a range equal to or larger than 0 and equal to or lower than 1, the pressure loss is reduced.

As shown in FIGS. 12 and 13, when the predetermined parameter is a shortest distance Y between the discharge portion 24 and the inner surface of the circumferential wall part 12 having the step part 12b, the distance Y is preferably equal to or larger than 1 mm. As shown in the graph in FIG. 13, it is understood that when the discharge portion 24 is in contact with the inner surface of the circumferential wall part 12 (Y=0), the pressure loss is relatively large while when the distance Y is equal to or larger than 1 mm, the pressure loss is reduced. More preferably, the distance Y=1 mm.

As described above, according to this embodiment, by providing the step part 12b on the inner surface of the circumferential wall part 12 positioned in vicinity of the discharge portion 24, the pressure loss of the coolant can be reduced.

Having described the case where, according to the aforementioned embodiment, the inlet portion 23 and the discharge portion 24 face each other diagonally, the invention is not limited to the configuration. For example, the inlet portion 23 and the discharge portion 24 may face each other in the direction (Y direction) orthogonal to the longitudinal direction of the cooler 3.

Having described the case where, according to the aforementioned embodiment, each of the inlet portion 23 and the discharge portion 24 has a long-hole shape that is long in the longitudinal direction (X direction), the invention is not limited to the configuration. The shapes, positions and so on of the inlet portion 23 and the discharge portion 24 can be changed as required.

According to the aforementioned embodiment, the number and positions of the semiconductor elements 7 are not limited to the configuration described above but can be changed as required.

According to the aforementioned embodiment, the number and layout of the circuit plates 15 are not limited to the configuration described above but can be changed as required.

Having described that, according to the aforementioned embodiment, the insulating substrate 6 and the semiconductor element 7 have a rectangular or square shape in planer view, the invention is not limited to the configuration. These components may be formed in a polygonal shape excluding those described above.

Having described the case where, according to the aforementioned embodiment, the semiconductor modules 2 are composed of three unit-modules aligned in the X direction in order of U-phase, V-phase and W phase, the invention is not limited to the configuration. The number and direction of arrangements of the unit modules can be changed as required. Although the case member 4 is provided integrally for the three phases of U-phase, V-phase and W-phase, the invention is not limited thereto but the case member 4 can be changed as required. The case member 4 may be divided to sections for unit modules.

Having described the embodiment and the variation examples, all or a part of each of the embodiment and the variation examples may be combined.

The invention is not limited to the aforementioned embodiment and variation examples, but various changes, replacements and variations can be made thereto without departing from the spirit and scope of the technical idea. Furthermore, if the technical idea can be realized by a different method with an advance of the technology or a different technology derived therefrom, the technical idea can be implemented by using the method. Therefore, the claims cover all embodiments that can be included within the scope of the technical idea.

Characteristic points according to the aforementioned embodiments are organized below.

A cooler according to the aforementioned embodiment includes a top plate, one surface of which serves as a heat dissipation surface, a plurality of fins provided on the heat dissipation surface, a circumferential wall part provided so as to surround outer circumferences of the plurality of fins along outer circumferential edges of the top plate, and a bottom plate bonded to distal ends of the circumferential wall part and the plurality of fins. A flow path for a coolant is formed by a space enclosed by the top plate, the circumferential wall part and the bottom plate, the bottom plate has an inlet portion and a discharge portion for the coolant, the inlet portion and the discharge portion are disposed so as to face each other diagonally with the plurality fins interposed therebetween, and an inner surface of the circumferential wall part has a step part that tilts from the inner surface of the circumferential wall part toward the discharge portion at a position neighboring to the discharge portion.

In the cooler according to the aforementioned embodiment, the space has a first header part leading to the inlet portion, a fin accommodating part accommodating the plurality of fins, and a second header part leading to the discharge portion, and the first header part and the second header part are disposed so as to face each other with the fin accommodating part interposed therebetween.

In the cooler according to the aforementioned embodiment, the top plate has a rectangular shape in planer view, the fin accommodating part is disposed along a longitudinal direction of the top plate, the first header part and the second header part face each other in a transverse direction of the top plate, and the discharge portion extends through the bottom plate in a thickness direction and has a long-hole shape extending in the longitudinal direction of the top plate.

In the cooler according to the aforementioned embodiment, the step part is disposed so as to overlap the discharge portion viewed from the transverse direction of the top plate.

In the cooler according to the aforementioned embodiment, the step part is formed such that a width of the second header part in the transverse direction of the top plate increases as a distance from the inlet portion to the second header part increases.

In the cooler according to the aforementioned embodiment, the step part tilts at an angle larger than 25 degrees and smaller than 60 degrees from the inner surface of the circumferential wall part toward the discharge portion in planer view.

In the cooler according to the aforementioned embodiment, the step part has a width in the transverse direction of the top plate equal to or larger than 2 mm and equal to or smaller than 5 mm.

In the cooler according to the aforementioned embodiment, a ratio (X/A) is equal to or larger than 0 and equal to or lower than 1 where X is a position of a corner close to the discharge portion of the step part from an end of the discharge portion on the inlet portion side and A is a width in the longitudinal direction of the discharge portion.

In the cooler according to the aforementioned embodiment, the shortest distance between the discharge portion and the inner surface of the circumferential wall part forming the step part is equal to or larger than 1 mm.

In the cooler according to the aforementioned embodiment, the inner surface of the circumferential wall part facing the discharge portion is curved outward in the first header part.

In the cooler according to the aforementioned embodiment, the first header part and the second header part have a guide wall that guides a flow of a coolant.

The semiconductor apparatus according to the aforementioned embodiment includes the aforementioned cooler, and a plurality of semiconductor elements disposed on the other surface of the top plate with an insulating substrate interposed therebetween. In this case, the plurality of semiconductor elements are aligned along a longitudinal direction of the cooler.

As described above, the present invention has an effect that the pressure loss of a coolant can be reduced and is particularly advantageous for a semiconductor apparatus applicable to a water-cooled semiconductor module.

REFERENCE SIGNS LIST 1 semiconductor apparatus
2 semiconductor module
3 cooler
4 case member
5 sealing resin
6 insulating substrate
7 semiconductor element
8 metallic wiring plate
9 top plate
10 fin
11 bottom plate
12 circumferential wall part
12a inner surface
12b step part
13 insulating plate
14 heat dissipation plate
15 circuit plate
16 P terminal
17 N terminal
18 M terminal
19 control terminal
20 through-hole
21 collection
22 cooling case
23 inlet portion
24 discharge portion
25 fixing hole
26 flange
27 attachment surface
28 O-ring
29 groove
G1 guide wall
G2 guide wall
S bonding material
S1 first header part
S2 fin accommodating part
S3 second header part
A width of the discharge portion
X distance
Y distance
θ tilt angle

What is claimed is:

1. A cooler, comprising; a top plate having a first surface forming a heat dissipation surface and a second surface on which a semiconductor device to be disposed; a plurality of fins provided on the heat dissipation surface of the top plate; a circumferential wall part provided along outer circumferential edges of the top plate so as to surround the plurality of fins; and a bottom plate bonded to ends of the circumferential wall part and the plurality of fins at a side opposite to a side where the top plate is disposed, the bottom plate having an inlet portion and a discharge portion for a coolant, the inlet portion and the discharge portion being disposed so as to face each other diagonally with the plurality fins interposed therebetween, wherein a flow path for the coolant is formed by a space enclosed by the top plate, the circumferential wall part and the bottom plate, an inner surface of the circumferential wall part has a step part at a position neighboring the discharge portion, the step part having a tilted surface so as to gradually increase a distance between the discharge portion and the tilted surface along the flow path at an area where the discharge portion is disposed, and the space forming the flow pass has a first header part leading to the inlet portion, a fin accommodating part accommodating the plurality of fins, and a second header part leading to the discharge portion, and the first header part and the second header part are disposed so as to face each other with the fin accommodating part interposed therebetween;

the cooler further comprising a plurality of guide walls that respectively guide a flow of the coolant in the first header part and the second header part.

2. The cooler according to claim 1, wherein the top plate has a rectangular shape having a long sides in a first direction and short sides in a second direction in a plan view of the cooler, the fin accommodating part is disposed along the first direction, the first header part and the second header part face each other in the second direction, and the discharge portion made of a through hole that extends through the bottom plate in a thickness direction, and having an oval shape extending in the first direction.

3. The cooler according to claim 2, wherein the step part is disposed so as to overlap the discharge portion viewed from the second direction.

4. The cooler according to claim 2, wherein the step part is formed such that in the second header part, a distance between the discharge portion and the tilted surface in the second direction increases with increasing distance from one end of the discharge portion toward an other end of the discharge portion in the first direction.

5. The cooler according to claim 4, wherein the step part tilts at an angle larger than 25 degrees and smaller than 60 degrees from the inner surface of the circumferential wall part toward the discharge portion in the plan view.

6. The cooler according to claim 4, wherein the step part has a width in the second direction in a range of 2 mm to 5 mm.

7. The cooler according to claim 4, wherein a ratio (X/A) is in a range of 0 to 1 where X is a distance between the one end of the discharge portion and a point at the inner surface of the circumferential wall where the tilted surface starts, and A is a length between the one end and the other end of the discharge portion.

8. The cooler according to claim 4, wherein a shortest distance between the discharge portion and the inner surface of the circumferential wall part forming the step part in the second direction is equal to or larger than 1 mm.

9. The cooler according to claim 1, wherein the inner surface of the circumferential wall part facing the discharge portion is curved outward in in the first header part.

10. A semiconductor apparatus, comprising:

the cooler according to claim 1, the cooler having a shape with a longitudinal direction; and a plurality of semiconductor elements disposed on the second surface of the top plate with an insulating substrate interposed therebetween, wherein the plurality of semiconductor elements are aligned along the longitudinal direction of the cooler.

* * * * *